United States Patent [19]

Brown

[11] Patent Number: 5,751,615

[45] Date of Patent: May 12, 1998

[54] IMPLEMENTATION OF A DIGITAL DECIMATION FILTER AND METHOD

[75] Inventor: Glen W. Brown, Austin, Tex.

[73] Assignee: Advanced Micro Devices, Inc., Sunnyvale, Calif.

[21] Appl. No.: 557,511

[22] Filed: Nov. 14, 1995

[51] Int. Cl.[6] .................................................. G06F 17/10
[52] U.S. Cl. ........................................................ 364/724.1
[58] Field of Search ............................................ 364/724.1

[56] References Cited

U.S. PATENT DOCUMENTS

| | | | |
|---|---|---|---|
| 4,590,457 | 5/1986 | Amir | 340/347 |
| 4,704,600 | 11/1987 | Uchimura et al. | 340/347 |
| 4,849,662 | 7/1989 | Holberg et al. | 307/520 |
| 4,851,841 | 7/1989 | Sooch | 341/143 |
| 4,876,542 | 10/1989 | van Bavel et al. | 341/143 |
| 4,918,454 | 4/1990 | Early et al. | 341/172 |
| 4,920,544 | 4/1990 | Endo et al. | 375/26 |
| 4,939,516 | 7/1990 | Early | 341/143 |
| 5,027,306 | 6/1991 | Dattorro et al. | 364/724 |
| 5,039,989 | 8/1991 | Welland et al. | 341/143 |
| 5,055,843 | 10/1991 | Ferguson, Jr. et al. | 341/143 |
| 5,061,928 | 10/1991 | Karema | 341/143 |
| 5,065,157 | 11/1991 | Ribner et al. | 341/143 |
| 5,068,660 | 11/1991 | Swanson et al. | 341/143 |
| 5,079,550 | 1/1992 | Sooch et al. | 341/143 |
| 5,084,702 | 1/1992 | Ribner | 341/143 |
| 5,103,229 | 4/1992 | Ribner | 341/143 |
| 5,148,166 | 9/1992 | Ribner | 341/143 |
| 5,148,167 | 9/1992 | Ribner | 341/143 |
| 5,153,593 | 10/1992 | Walden et al. | 341/143 |
| 5,157,395 | 10/1992 | Del Signore et al. | 341/143 |
| 5,162,799 | 11/1992 | Tanimoto | 341/143 |
| 5,184,130 | 2/1993 | Mangelsdorf | 341/156 |
| 5,189,419 | 2/1993 | Lyden | 341/143 |
| 5,198,817 | 3/1993 | Walden et al. | 341/143 |
| 5,208,597 | 5/1993 | Early et al. | 341/172 |
| 5,210,537 | 5/1993 | Mangelsdorf | 341/156 |
| 5,274,375 | 12/1993 | Thompson | 341/143 |
| 5,283,578 | 2/1994 | Ribner et al. | 341/143 |
| 5,298,900 | 3/1994 | Mauthe et al. | 341/143 |
| 5,311,181 | 5/1994 | Ferguson, Jr. et al. | 341/143 |
| 5,590,065 | 12/1996 | Lin | 364/724.1 |
| 5,617,344 | 4/1997 | Young et al. | 364/724.1 |

FOREIGN PATENT DOCUMENTS

| | | | |
|---|---|---|---|
| 0328318A2 | 3/1989 | European Pat. Off. | H04B 14/04 |
| 0450947A2/A3 | 4/1991 | European Pat. Off. | H03M 3/02 |

OTHER PUBLICATIONS

"A 16-Bit Oversampling A-to-D Conversion Technology Using Triple-Integration Noise Shaping," Matsuya, et al., *IEEE Journal of Solid State Circuits*, vol. SC-22, No. 6, pp. 921-929, Dec. 1987.

"A Third-Order Multistate Sigma-Delta Modulator with Reduced Sensitivity to Nonidealities," Ribner, et al., *IEEE Journal of Solid-State circuits*, vol. 26, No. 12, pp. 1764-1774, Dec. 1991.

"A Higher Order Topology for Interpolative Modulators for Oversampling A/D Converters," Chao, et al., *IEEE Transactions on Circuits and Systems*, vol. 37, No. 3, pp. 309-318, Mar. 1990.

"A Self-Calibrating 15 Bit CMOS A/D Converter," Hae-Seung Lee et al.; *IEEE Journal of Solid State Circuits*, vol. SC-19, No. 6, Dec. 1984.

"A 12-Bit Successive-Approximation-Type ADC with Digital Error Correction," Kanit Bacrania, *IEEE Journal of Solid-State Circuits*, vol. SC-21, No. 6, Dec. 1986.

(List continued on next page.)

*Primary Examiner*—David H. Malzahn
*Attorney, Agent, or Firm*—Stanford & Bennett, L.L.P.; Joseph W. King, Jr.

[57] ABSTRACT

The present invention is for an implementation of a multi-stage digital decimation filter and a method of decimating a multi-bit input signal, where n/2 additions are performed, where n=the number of bits in each filter coefficient. A compensation stage is also provided. Scaling and multiplication of data with coefficients is performed using a common architecture to the Decim. 2 and Decim. 3 stages. Coefficient values, having an associated scaling factor, are stored in memory. The coefficients are stored in coded form, and are then decoded prior to multiplication by the data values.

10 Claims, 11 Drawing Sheets

DECIMATOR 1 IMPLEMENTATION

OTHER PUBLICATIONS

"A Third–Order Cascaded Sigma–Delta Modulators," Louis A. Williams III et al., *IEEE Transactions on Circuits and Systems*, 38 (1991) May, No. 5, New York, pp. 489–497.

"Low–Distortion Switched–Capacitor Filter Design Techniques," Kuang–Lu Lee, et al., *IEEE Journal of Solid–State Circuits*, vol. SC–20, No. 6, Dec. 1985, pp. 1103–1113.

"The Implementation of Digital Echo Cancellation in Codecs," Vladimir Friedman, et al., *IEEE Journal of Solid–State Circuits*, vol. 25, No. 4, Aug. 1990, pp. 979–986.

"A 192ks/s Sigma–Delta ADC with Integrated Decimation Filters Providing –97.4dB THD," Mark A. Alexander, et al., ISSCC94/Session 11/Oversampled Data Coversion/Paper TP 11.3, 1994 *IEEE International Solid–State Circuits Conference*.

"A Voiceband Codec with Digital Filtering," James C. Candy, et al., *IEEE Transaction on Communications*, vol. COM–29, No. 6, Jun. 1981, pp. 815–829.

"A Per–Channel A/D Converter Having 15–Segment μ–255 Companding," James C. Candy, et al., *IEEE Transactions on Communications*, vol. COM–24, Jan. 1976.

"Switched–Capacitor Second–Order Noise–Shaping Coder," G. Lainey, et al., *Electronics Letters*, 17th Feb. 1983, vo. 19, No. 4, pp. 149–150.

"Multirate Filter Designs Using Comb Filters," Shuni Chu, et al., *IEEE Transactions on Circuits and Systems*, vol. CAS–31, No. 11, Nov. 1984, pp. 913–924.

"A 120dB Linear Switched–Capacitor Delta–Sigma Modulator," Donald A. Kerth, et al., 1994 *IEEE International Solid–State Circuits Donference, Digest of Technical Papers*, TP 11.6, pp. 196–197, IDDCC94/Thursday, Feb. 17, 1994/Sea Cliff.

"A Stereo 97dB SNR Audio Sigma–Delta ADC," Tapani Ritoniemi, et al., 1994 *IEEE International Solid–State Circuits Conference, ISSCC94*/Session 11/Oversampled Data Conversion/Paper TP 11.7, pp. 198–199.

"A Digitally–Corrected 10b Delta–Sigma Modulator," Charles D. Thompson, et al., 1994 *IEEE International Solid–State Circuits Conference, ISSCC94*/Session 11/Oversampled Data Conversion/Paper TP 11.5, pp. 194–195.

"An Economical Class of Digital Filters for Decimation and Interpolation," Eugene B. Hogenauer., *IEEE Transactions on Acoustics, Speech, and Signal Processing*, vol. ASSP–29, No. 2, Apr. 1981, pp. 155–162.

"Decimation for Sigma Delta Modulation," James C. Candy, *IEEE Transactions on Communications*, vol. COM–34, No. 1, Jan. 1986, pp. 72–76.

"Multirate Digital Filters, Filter Banks, Polyphase Networks, and Applications: A Tutorial," P. P. Vaidyanathan, *Proceedings of the IEEE*, vol. 78, No. 1, Jan. 1990, pp. 56–93.

"A Multistage Delta–Sigma Modulator without Double Integration Loop," Toshio Hayashi, et al., 1986 *IEEE International Solid–State Circuits Conference, ISSCC 86*/Thursday, Feb. 20, 1986/California Pavilion C, pp. 182–183.

"Circuit and Technology Consideration for MOS Delta–Sigma A/D Converter," Max W. Hauser et al., 1986 *IEEE*, pp. 1310–1315.

"A 16b Oversampling A/D Conversion Technology using Triple Integration Noise Shaping," Yasuyuki Matsuya, et al., 1987 *IEEE International Solid–State Circuits Conference, ISSCC 87*/Wednesday, Feb. 25, 1987/Trianon Ballroom, pp. 48–50.

"A 3–μm CMOS Digital Codec with Programmable Echo Cancellation and Gain Setting," Paul Defraeye, et al., *IEEE Journal of Solid–State Circuits*, vol. SC–20, No. 3, Jun. 1985, pp. 679–687.

"Fourth Order Sigma–Delta Modulator Circuit For Cigital Audio and ISDN Applications," T. Karema, et al., Tampere University of Technology, Finland, pp. 223–227.

"Area–Efficient Multichannel Oversampled PCM Voice–Band Coder," Bosco H. Leung, et al., *IEEE Journal of Solid–State Circuits*, vol. 23, No. 6, Dec. 1988, pp. 1351–1357.

"Design and Implementation of Digital FIR Filters" P. P. Vaidyanathan, Chapter 2 in *Handbook of DSP Engineering Applications*, D. F. Elliott, editor, Academic Press, 1987.

DECIMATOR 1 BLOCK DIAGRAM

DECIMATOR 1 IMPLEMENTATION

DECIMATOR 2 ARCHITECTURE-TRANSPOSED METHOD

BIT WIDTH =<NUMBER OF BITS, NUMBER OF INTEGER BITS>
ALL REGISTERS CLOCKED AT 2Fs

DECIMATOR 3 ARCHITECTURE $N = 59$

BIT WIDTH = <NUMBER of BITS, NUMBER of INTEGER BITS>

DECIMATOR 3 ARCHITECTURE - TRANSPOSED METHOD

BIT WIDTH=<NUMBER of BITS, NUMBER of INTEGER BITS>
ALL REGISTERS CLOCKED at 2Fs

COMPENSATION FILTER - TRANSPOSED METHOD

BIT WIDTH = <NUMBER of BITS, NUMBER of INTEGER BITS>
ALL REGISTERS CLOCKED at Fs

IMPLEMENTATION OF A DIGITAL DECIMATION FILTER AND METHOD

BACKGROUND OF THE INVENTION

1. Field of the Invention

This invention relates to an implementation of a digital decimation filter. More particularly, the invention relates to an implementation of a multi-stage digital decimation filter for an analog-to-digital (A/D) converter circuit.

2. Discussion of Related Technology

Commonly utilized digital decimation filters employ bit multiplication schemes that require hardware to perform a series of shifts and adds to multiply data by a particular filter coefficient. This typically requires the use of an adder for each group of bits to be multiplied where the number of adders is greater than one half the number of bits of the filter coefficient to be multiplied.

These commonly utilized filter also typically do not include a common data path for multiplication scaling of the numbers to be multiplied and accumulation of the products.

SUMMARY OF INVENTION

Described herein is a novel implementation of a multi-stage digital decimation filter and a method of decimating a multi-bit signal. The present invention codes a number, preferably a filter coefficient, stores the coded number, decodes the number and performs multiplication functions upon the decoded number. This method results in a reduced requirement for adders, such that the number of required addition operations is equal to one half the number of bits representing the known number to be multiplied, typically bits of a filter coefficient, by another number, typically the data.

The present invention utilizes a common data path for multiplication of the numbers and accumulation of the products. This greatly reduces the amount of required hardware to perform the filter multiplications.

DETAILED DESCRIPTION OF THE PREFERRED EMBODIMENT

Figure 1:
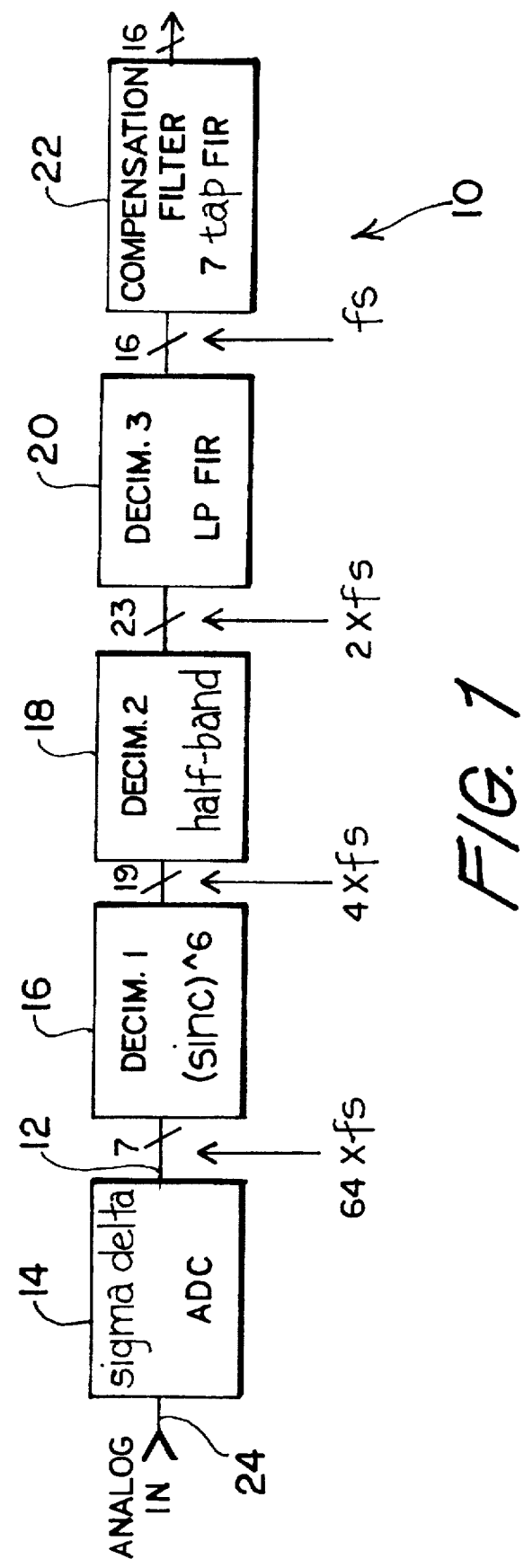
FIG. 1 is a block diagram of an A/D circuit utilizing the multi-stage decimator of the present invention.

The block diagram of an A/D circuit 10 utilizing the present invention is depicted in FIG. 1. Analog input data 24 is provided to delta-sigma ADC block 14, where the signal is converted to a 64 times over-sampled, or 64 Fs, digital input signal 12. This input signal 12 is input to the stages of the decimator (16, 18 and 20), where the signal is decimated by a factor of 16, from the sample frequency, 64 Fs, to 4 times the sample rate, 4 Fs, and is output to compensation filter 22 as a 16 bit signal. The 64 Fs input signal 12 is assumed to be band limited to Fs/2 by an anti-aliasing filter of adequate attenuation in the delta-sigma ADC block 14. The multi-stage decimation filter structure (16, 18 and 20) is more fully described in application Ser. No. 08/333,403, filed Nov. 2, 1994, entitled "A Digital Decimation and Compensation Filter System", assigned to the common assignee of the present invention and incorporated herein for all purposes. The fourth stage of the A/D circuit 10 is a compensation filter 22. Compensation filter 22 may be unnecessary in some A/D applications.

As described and shown in FIG. 1, the decimation of the 64 Fs input signal 12 is performed in three stages using decimators Decim. 1 (16), Decim. 2 (18) and Decim. 3 (20). Decim. 1 includes a 6th order sinc filter to decimate by 16. This filter produces some rolloff in the passband. The next decimation stage, Decim. 2, reduces the sample rate by 2 to 2 Fs using a half-band filter with an attenuation of approximately 100 dB and a flat response in the passband. The third stage, Decim. 3, also uses a half-band filter having a cutoff starting at 0.45 Fs and a stopband attenuation of approximately 100 dB starting at 0.5 Fs. The final filter, a 7 tap linear phase FIR compensation filter 22, is used to compensate for the passband rolloff in Decim. 1.

The frequency response transfer function for the Decim. 1 stage is as follows:

$$H_1(z) = \left[ \frac{1(1-z^{16})}{16(1-z^{-1})} \right]^6 \tag{1}$$

Figure 2:
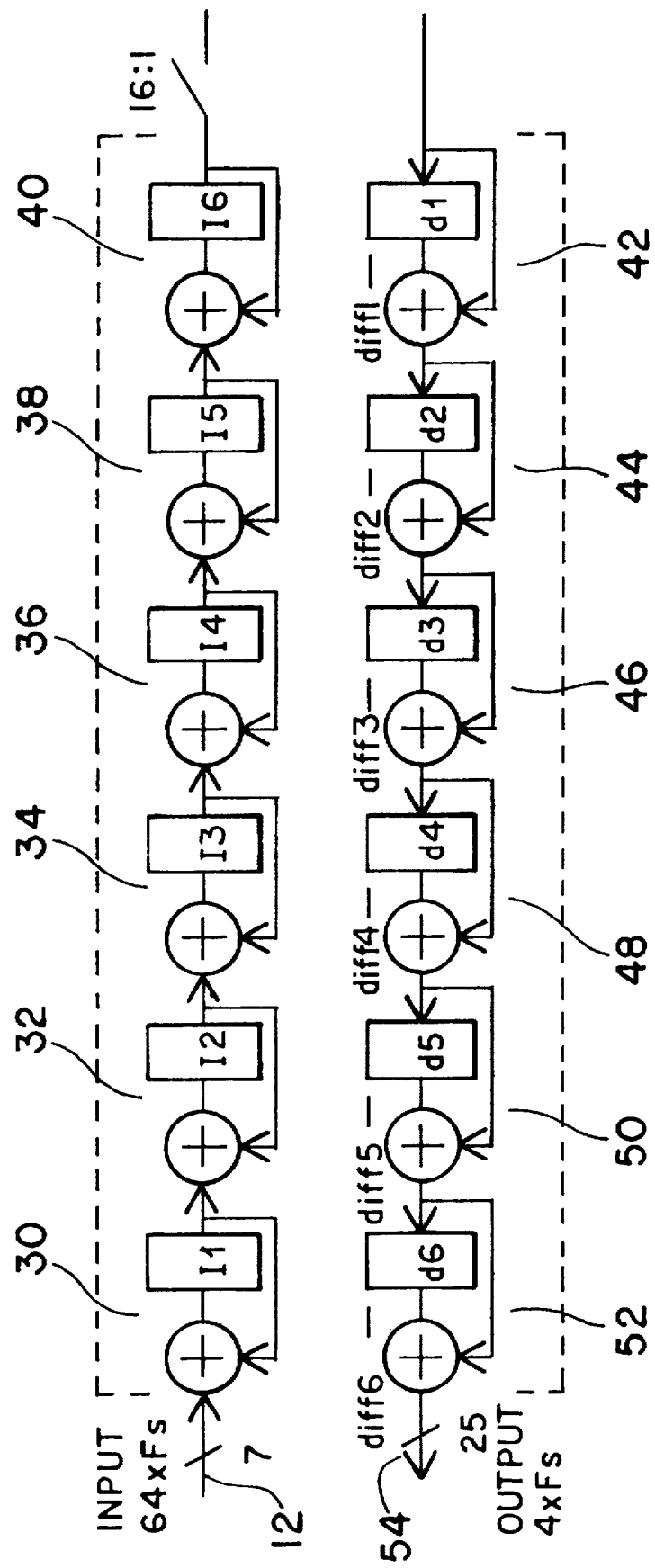
FIG. 2 is an embodiment of the functional block diagram of the Decim. 1 stage.
Figure 4:
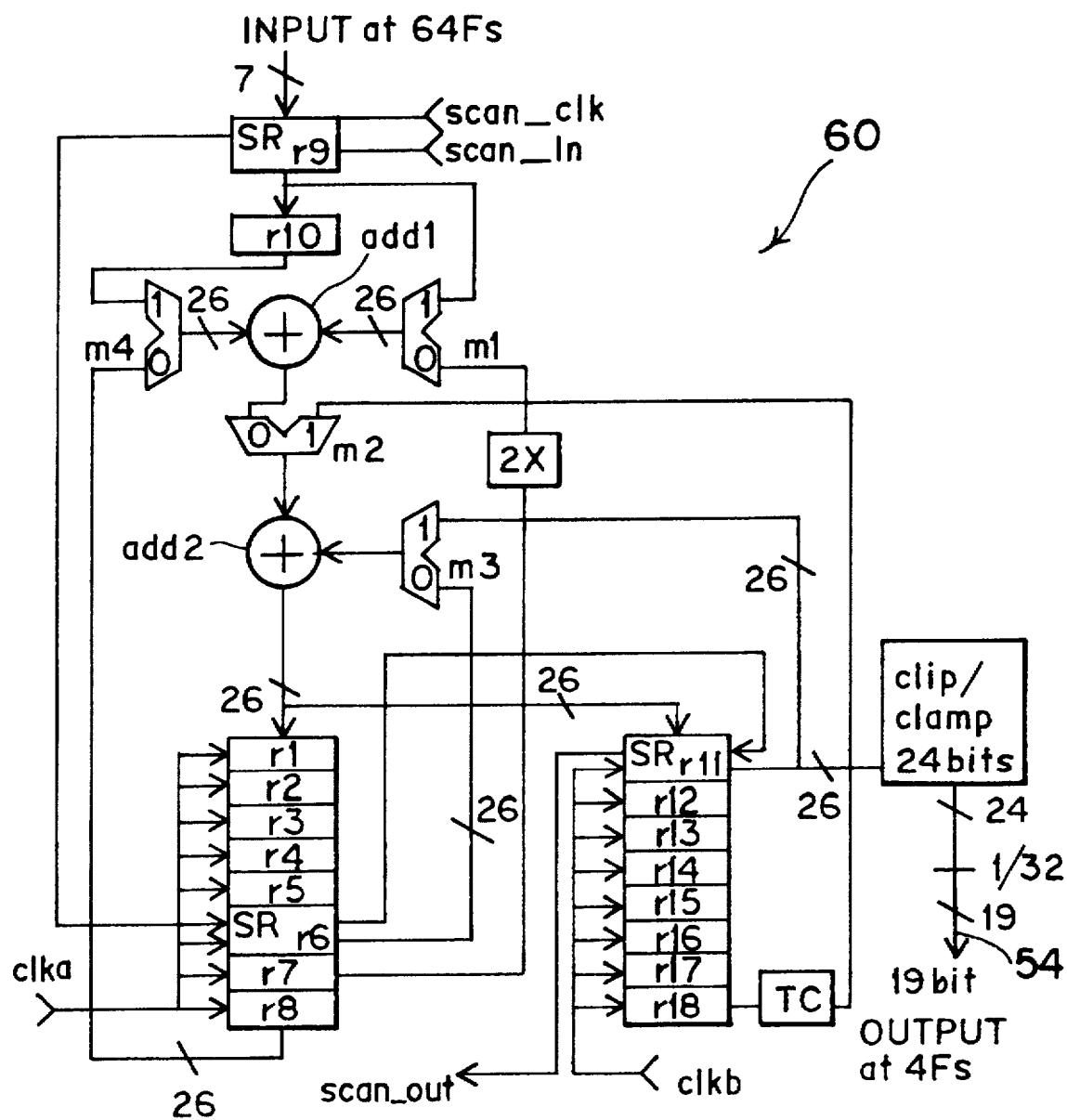
FIG. 4 is a block diagram of the preferred architecture for the Decim. 1 stage.
Figure 11:
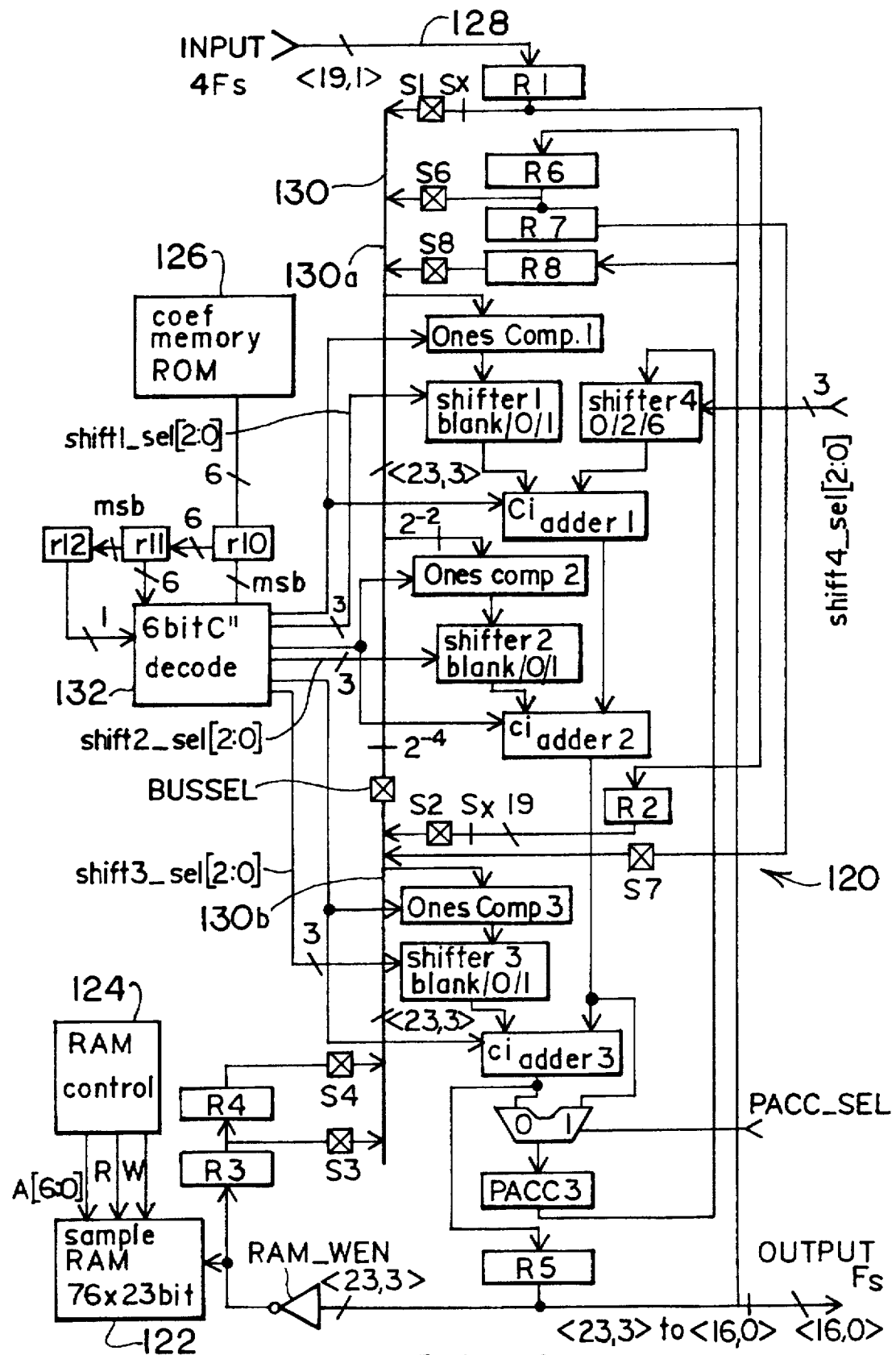
FIG. 11 is a block diagram of the preferred architecture for the Decim. 2 and Decim. 3 stages and the compensation stage.

The calculations implementing the frequency response of equation (1) for Decim. 1 are performed in one functional block, shown in FIG. 2 and implemented by the architecture of FIG. 4. The calculations implementing Decim. 2, Decim. 3, and compensation filter block 22 are performed in a second functional block as shown in FIG. 11, and will be described below in further detail.

Decim. 1

The six 64 Fs integrator stages in Decim. 1 (30, 32, 34, 36, and 40), shown in FIG. 2, preferably operate at a maximum clock frequency of 3.07 MHz. By performing the six integrator stages serially, a 18.4 MHz clock is required for each integrator stage. The maximum desired clock frequency is one half the fastest crystal frequency, or 12.29 MHz. This 12.29 MHz clock is preferably used for Decim. 3, which is the largest filter.

Figure 3:
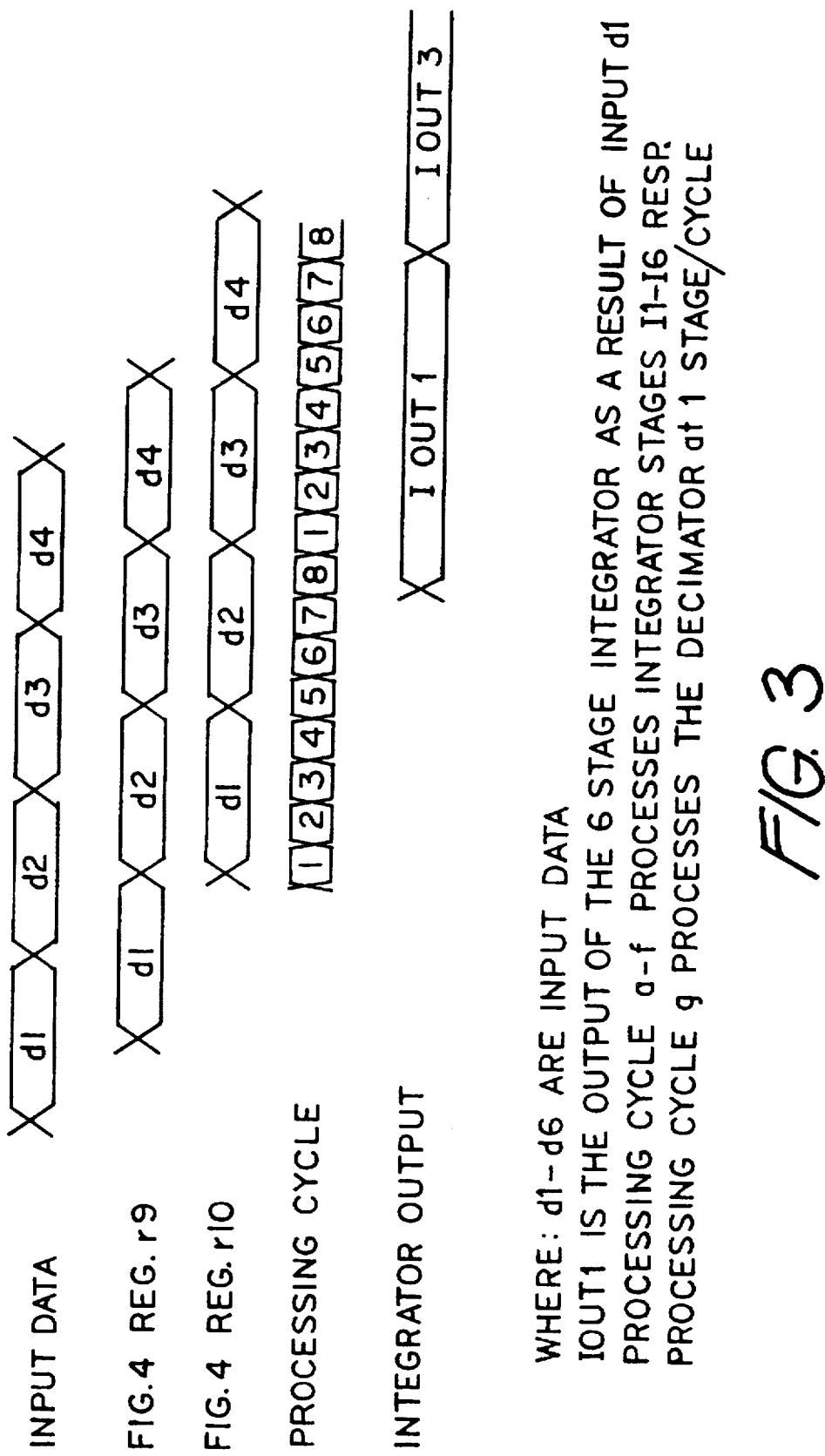
FIG. 3 is partial timing diagram for calculations performed by the preferred embodiment of the present invention.

The method described below, and illustrated in the partial timing diagram of FIG. 3, uses a the architecture of FIG. 4 for calculating the output of each integrator stage of Decim. 1 by utilizing two 64 Fs input data words 12 in one 256 Fs cycle. This requires 6 cycles for every other new integrator output. In the preferred method, only the output of the even integrators (32, 36 and 40) are calculated. However, the output of each integrator stage of Decim. 1 is updated at a 32 Fs rate. By running the Decim. 1 block at 8×(32 Fs)=256 Fs, 6 cycles are used to calculate the even integrator outputs, and the seventh cycle is used to calculate the output of the 6-stage comb filter, which includes differentiators 42, 44, 46, 48, 50 and 52 of FIG. 2. The 8th cycle is unused as a no op. This process requires a 256 Fs clock for operation. A control block, not shown, generates clocks clka and clkb. Clock clka provides a clock to registers r1–r8 of FIG. 4 during cycles 1–6 from FIG. 3. Clock clkb provides a clock to registers r11–r18 of FIG. 4 during subcycles 7(a)–7(f).

To represent the data at the output of the FIG. 2 integration stages within Decim. 1, let $I_1(n)$=value of the first integrator, 30, at a 32 Fs clock rate (n). For a given output of (n+1), i.e. after one 32 Fs clock cycle, the first two integrators 30, 32 are described as follows:

$$I_1(n+1)=I_1(n)+d_{odd}(n)+d_{even}(n) \text{ where } d_{odd}=\text{the first data of the integrator pair 30, 32} \quad (2)$$

$$I_2(n+1)=I_2(n)+2*I_1(n)+d_{odd}(n) \text{ where } d_{even}=\text{the second data of the integrator pair 30, 32} \quad (3)$$

The output of the 3rd–6th integrators, 34, 36, 38 and 40, is described in the following manner:

$$I_i(n+1)=I_i(n)+2*I_{i-1}(n)+I_{i-2}(n) \text{ for } i=3,4,5,6 \quad (4)$$

The preferred architecture shown in FIG. 4, implements the Decim. 1 block of FIG. 2 and performs the actual calculations for the frequency response for Decim. 1 as per equation (1). Referring to FIG. 3, for a single pair of input data for integrators 1 and 2 (30, 32), the following 8 processing cycles, 1–8, are each performed at a 32 Fs rate. Each cycle 7 executes a subcycle, (a)–(h), at a 4 Fs rate. These subcycles are described below.

To describe the operation of the Decim. 1 architecture 60 of FIG. 4, it is assumed that the initial storage conditions for some of the registers are as follows: r1=$I_6$(n−1); r6=$I_1$(n−1); r2=$I_5$(n−1); r7=$I_6$(n−2); r3=$I_4$(n−1); r8=$I_5$(n−2); r4=$I_3$(n−1); r9=$d_{even}$(n); r5=$I_2$(n−1); and r10=$d_{odd}$(n).

In cycle 1, the value in r10 is provided to add1, the value in r9 is provided to add1, the value of r6 is input to add2 via mux m3, and the equation $I_1(n)=I_1(n-1)+d_{odd}(n)+d_{even}(n)$ is calculated, where the output of add2, sum2=$I_1$(n); the output of add1, sum1=r10+r9; and sum2=sum1+r6. The clock is clka.

In cycle 2, the value in r10 is provided to add1, the value 2*r7 is provided to add1, the value of r6 is provided to add2, and the equation $I_2(n)=I_2(n-1)+2*I_1(n-1)+d_{odd}(n)$ is calculated, where sum2=$I_2$(n); sum1=r10+2*r7; and sum2=sum1+r6. The clock is clka.

In cycle 3, the value of r8 is provided to add1, the value 2*r7 is provided to add1, the value of r6 is provided to add2, and the equation $I_3(n)=I_3(n-1)+2*I_2(n-1)+I_1(n-1)$ is calculated, where sum2=$I_3$(n); sum1=r8+2*r7; and sum2=sum1+r6. The clock is clka.

In cycle 4, the value of r8 is provided to add1, the value of 2*r7 is provided to add1, the value of r6 is provided to add2, and the equation $I_4(n)=I_4(n-1)+2*I_3(n-1)+I_2(n-1)$ is calculated, where sum2=$I_4$(n); sum1=r8+2*r7; and sum2=sum1+r6. The clock is clka.

In cycle 5, the value of r8 is provided to add1, the value 2*r7 is provided to add1, the value of r6 is provided to add2, and the equation $I_5(n)=I_5(n-1)+2*I_4(n-1)+I_3(n-1)$ is calculated, where sum2=$I_5$(n); sum1=r8+2*r7; and sum2=sum1+r6. The clock is clka.

In cycle 6, the value of r8 is provided to add1, the value 2*r7 is provided to add1, the value of r6 is provided to add2, and the equation $I_6(n)=I_6(n-1)+2*I_5(n-1)+I_4(n-1)$ is calculated, where sum2=$I_6$(n); sum1=r8+2*r7; and sum2=sum1+r6. The clock is clka. Additionally, the new value of $I_6$(n) is latched in r11.

In cycle 7, regardless of whether in subcycle (a)–(h), the Decim. 1 output 54 is calculated, serially. Subcycles (a)–(h) of cycle 7 are sequenced through at a rate of 4 Fs. For the following operations in the various subcycles of cycle 7, m=4 Fs rate, with a subsampled 64 Fs output from integrator 40 of FIG. 2. It is assumed that during subcycle 7(a), a new output from integrator 40 must be subsampled to provide the $I_6$(n) term.

In subcycle (a), the value $diff_1(m)=I_6(n)-I_6(n-8)$ is calculated, where the value of r11 is provided to add2, the negative value of r18 is provided to add2, and sum2=$diff_1$(m). The clock is clkb.

In subcycle (b), the value $diff_2(m)=diff_1(m)-diff_1(m-1)$ is calculated, where the value of r11 is provided to add2, the negative value of r18 is provided to add2, and sum2=$diff_2$(m). The clock is clkb.

In subcycle (c), the value $diff_3(m)=diff_2(m)-diff_2(m-1)$ is calculated, where the value of r11 is provided to add2. The negative value of r18 is provided to add2, and sum2=$diff_3$(m). The clock is clkb.

In subcycle (d), the value $diff_4(m)=diff_3(m)-diff_3(m-1)$ is calculated, where the value of r11 is provided to add2, the negative value of r18 is provided to add2, and sum2=$diff_4$(m). The clock is clkb.

In subcycle (e), the value $diff_5(m)=diff_4(m)-diff_4(m-1)$ is calculated, where r11 is provided to add2, the negative value of r18 is provided to add2, and sum2=$diff_5$(m). The clock is clkb.

In subcycle (f), the value $diff_6(m)=diff_5(m)-diff_5(m-1)$ is calculated, where the value of r11 is provided to add2, the negative value of r18 is provided to add2, and sum2=$diff_6$(m). The clock is clkb.

In subcycle (g) the Decim. 1 output 54 is latched.

In subcycle (h), a no op is performed.

In cycle 7, a no op is performed.

Decim. 2

Figure 5:
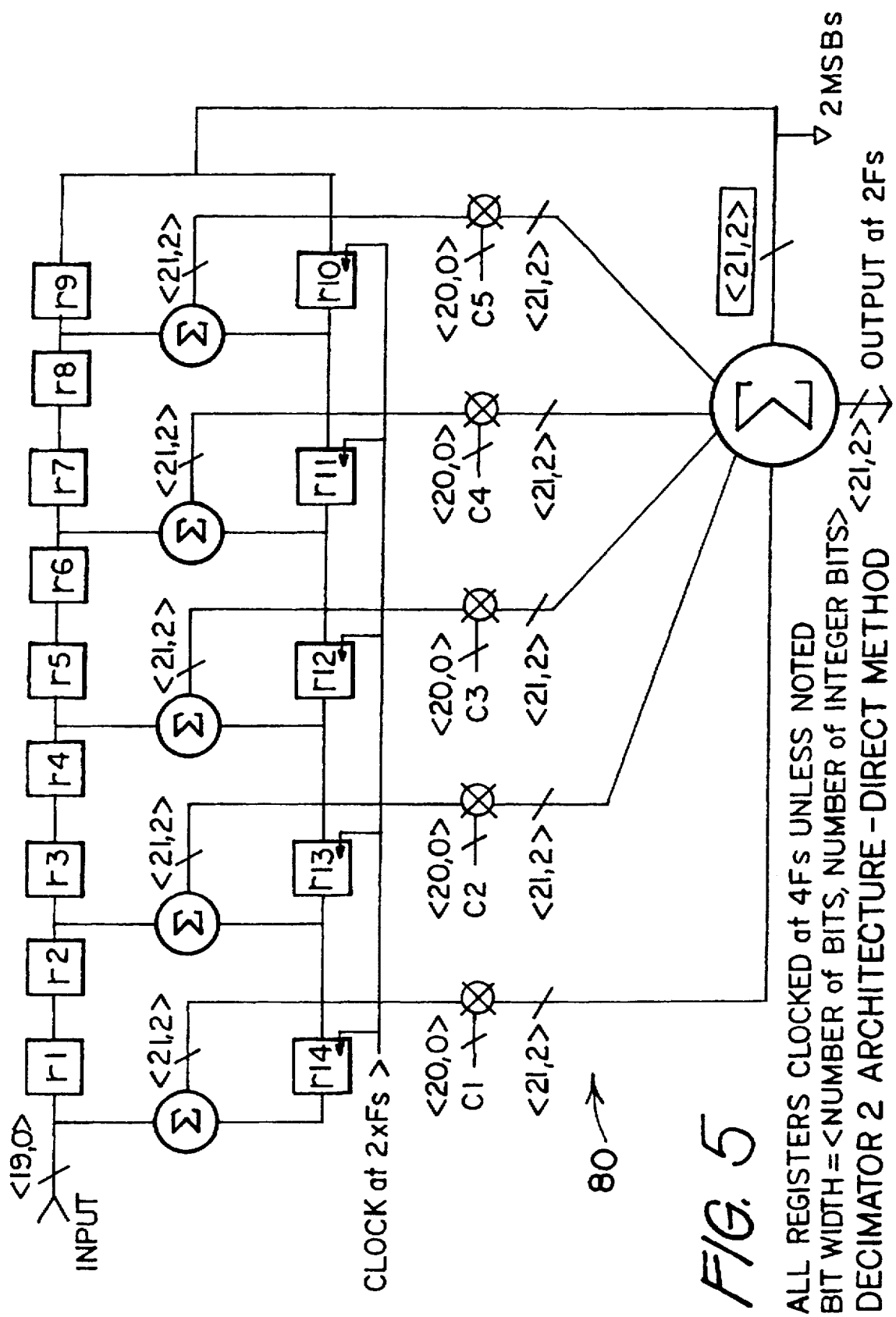
FIG. 5 is an embodiment of the functional block diagram of the Decim. 2 stage.

Referring to FIG. 1, Decim. 2 is a liner phase half-band FIR filter. It has equal size stopband and passband and equal ripple in the passband and stopband. A special property of half-band filters is that every other coefficient is zero. This can lead to advantages in the implementation. The Decim. 2 filter functional architecture 80, shown in FIG. 5, is implemented in a direct form. When the filter is in the form of a decimate by 2 and when the filter is transposed, an efficient regular structure results. This results in all processing of the filter calculation being performed at the lower rate of twice the sample frequency, i.e. 2 Fs, and all coefficients multiply the same data sample, the 19 bit input data, which has been output as 4 Fs output signal 54 from Decim. 1 (FIG. 4). The architecture 80 of Decim. 2 (FIG. 5) is preferably implemented in a transposed form as shown in the FIG. 6 functional block 90.

All registers, r1–r9, of block 90 are clocked at the rate of 2 Fs. The switch 92 on the input of block 90 toggles at the rate of 2 Fs, alternating input data into the registers for summation and to be multiplied by the coefficient data, c1–c5. This is accomplished because, as can be seen from FIG. 5, only the input data and data delayed by an even number of cycles are summed and multiplied by the coefficients, while the input data delayed by an odd number of clock cycles is summed with the products of the data times the coefficients.

Figure 6:
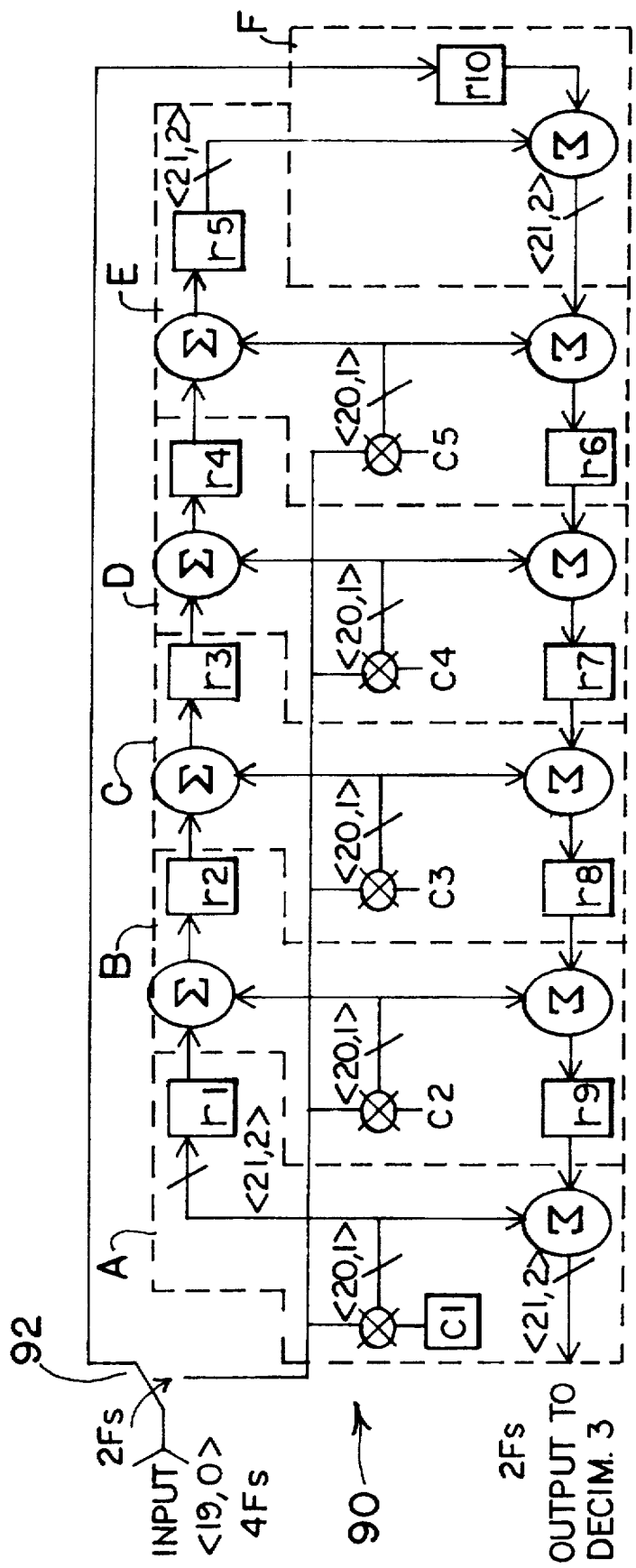
FIG. 6 is the preferred embodiment of the functional block diagram of the Decim. 2 stage.

Referring to FIG. 5, the odd delayed data is shown as shown as being stored for 11 clock cycles prior to being used. When the Decim. 2 filter is transposed, as in FIG. 6, the odd delayed data can be added in directly, without first being stored. The Decim. 2 filter coefficients are given in Table 1 below. The values are the non-zero coefficients used for multiplication by the data as shown in FIGS. 5 and 6. The center coefficient, C3, having a magnitude of 1.0, is not shown in Table 1, and is implemented by the data in r9 of FIG. 5 and r10 of FIG. 6.

Decim. 2 is implemented in FIG. 11 by performing the calculations as per equation (5). The operation of FIG. 11 will be described below in further detail.

The output of Decim. 2, as implemented by FIG. 6, is given by equation (5).

$$\text{Output}_n = (d_{n-10} + d_n)C1 + r10_{n-5} + \sum_{i=2}^{5}(d_{n-10+i} + d_{n+1-i})Ci \quad (5)$$

where: d is the data at the input, available at 4 Fs;

the subscript "n" is a reference to clock cycle, where "n+1" is 1 clock cycle later;

C# is the coefficient as given in Table 1, where # is the coefficient number; and r10 is the data stored in register "r10" of FIG. 6.

Decim. 2 Coefficients

TABLE 1

| coefficient number | coefficient value |
|---|---|
| 1 | 0.0016956329345703125 |
| 2 | -0.0121631622314453125 |
| 3 | 0.04854583740234375 |
| 4 | -0.1517887115478515625 |
| 5 | 0.6137218475341796875 |

Decim. 3

Figure 7:
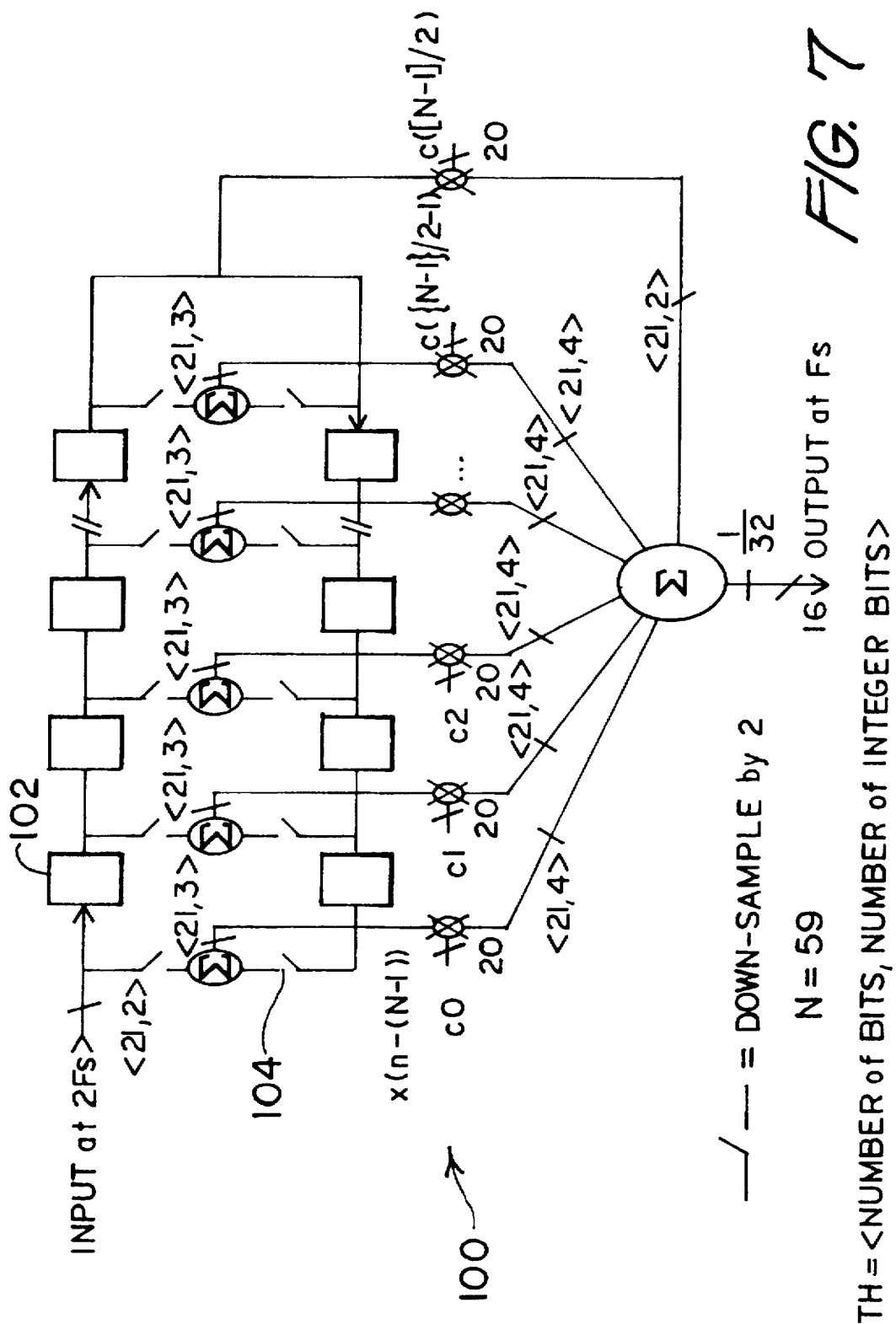
FIG. 7 is an embodiment of the functional block diagram of the Decim. 3 stage.

Decim. 3, 20 (FIG. 1) is a linear phase FIR, having symmetrical coefficients. It is preferably a flat passband response half-band filter having 59 taps. It has approximately 100 dB of attenuation in the stopband and a less than +/- 0.1 dB in the passband. Its cutoff starts at 0.45 Fs and stops at 0.5 Fs. The input data for Decim. 3 is output from the Decim. 2 stage (FIG. 1) at 2 Fs and is decimated in Decim. 3 by a factor of 2, to the sample rate, Fs. A special property of half-band filters is that every other coefficient is zero. When used as a decimate by two, Decim. 3 computes one output for every two data samples input. The functional block architecture 100 of the Decim. 3 filter, preferably implemented in a direct method, is shown in FIG. 7.

The coefficients are given by the subscripted "c" and the registers 102 are clocked at the input data rate of 2 Fs. The switches 104 shown in FIG. 7 close every other cycle, representing a calculation of an output value at the sample rate, Fs. The Decim. 3 stage is preferably implemented in a transposed method, the same as Decim. 2.

Figure 8:
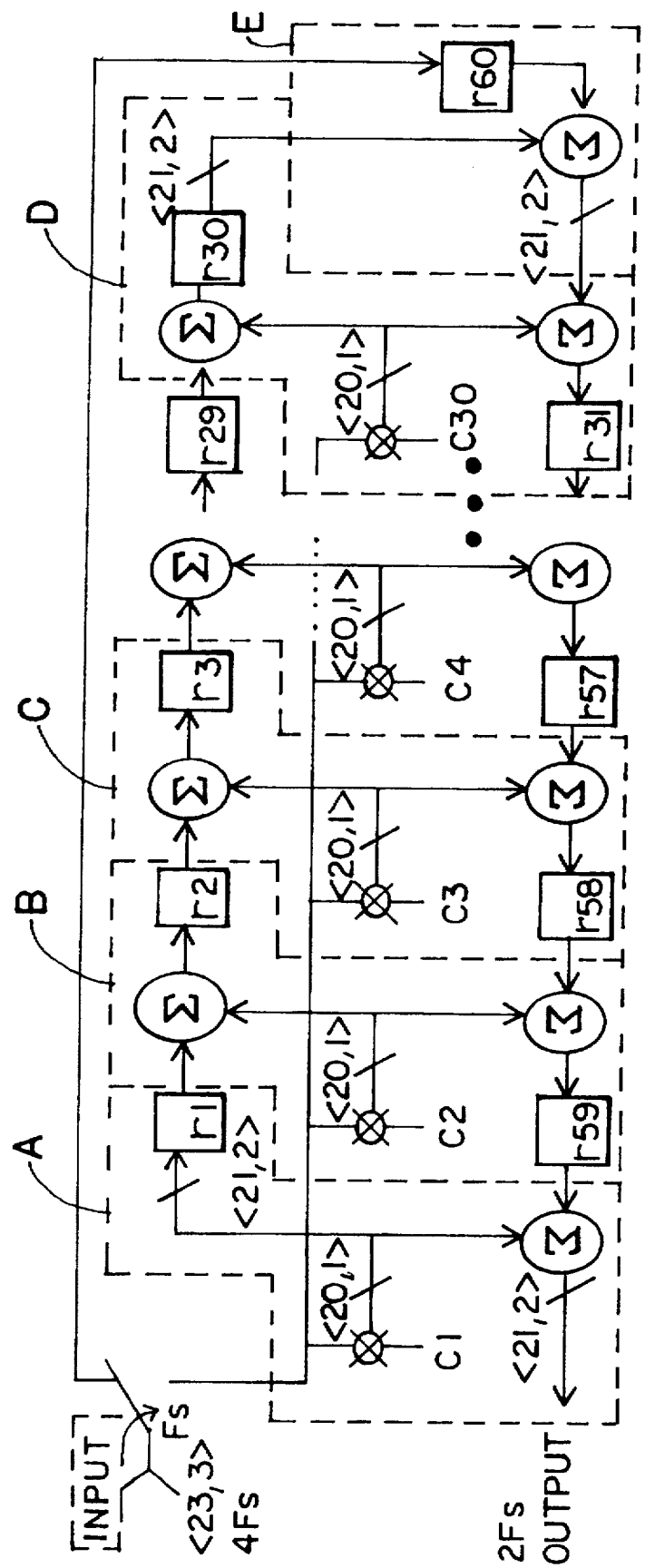
FIG. 8 is the preferred embodiment of the functional block diagram of the Decim. 3 stage.

The transfer function of Decim. 3 is given by equation (x). The same structure results as in FIG. 6, with the extension to 30 coefficients instead of 5, as shown in FIG. 8. Since Decim. 2 and Decim. 3 both interpolate by a factor of 2, both have the same method of alternating input data between multiplication by the coefficients and summing into the data path. The coefficients for Decim. 3 are given in Table 2. The values are the non-zero coefficients used for multiplication by the data as shown in FIGS. 7 and 8. The center coefficient, having a magnitude of 1.0, is not shown in Table 2 and is implemented by the data in register r60 of FIG. 8

The output of Decim. 3, as implemented by FIG. 8, is given by equation (6).

$$\text{Output}_n = (d_{n-60} + d_n)C1 + r60_{n-30} + \sum_{i=2}^{30}(d_{n-60+i} + d_{n+1-i})Ci \quad (6)$$

where: d is the data at the input, available at 2 Fs;

the subscript 'n' is a reference to clock cycle, where 'n+1' is 1 clock cycle later;

C# is the coefficient as given in Table 2, where # is the coefficient number; and r60 is the data stored in register "r10" of FIG. 8.

Decim. 3 Coefficients

TABLE 2

| coefficient number | coefficient value |
|---|---|
| 1 | -0.0000286102294921875 |
| 2 | 0.000049591064453125 |
| 3 | -0.0000934600830078125 |
| 4 | 0.00016021728515625 |
| 5 | -0.0002574920654296875 |
| 6 | 0.0003948211669921875 |
| 7 | -0.0005855560302734375 |
| 8 | 0.0008392333984375 |
| 9 | -0.0011749267578125 |
| 10 | 0.00160980224609375 |
| 11 | -0.002162933349609375 |
| 12 | 0.0028553009033203125 |
| 13 | -0.0037174224853515625 |
| 14 | 0.0047740936279296875 |
| 15 | -0.006061553955078125 |
| 16 | 0.007617950439453125 |
| 17 | -0.009490966796875 |
| 18 | 0.011737823486328125 |
| 19 | -0.014432907104492187 |
| 20 | 0.0176715850830078125 |
| 21 | -0.0215911865234375 |
| 22 | 0.026386260986328125 |
| 23 | -0.032350540161132812 |
| 24 | 0.039966583251953125 |
| 25 | -0.050060272216796875 |
| 26 | 0.0642070770263671875 |
| 27 | -0.085781097412109375 |
| 28 | 0.1235866546630859375 |
| 29 | -0.2099456787109375 |
| 30 | 0.6358623504638671875 |

Compensator

Figure 9:
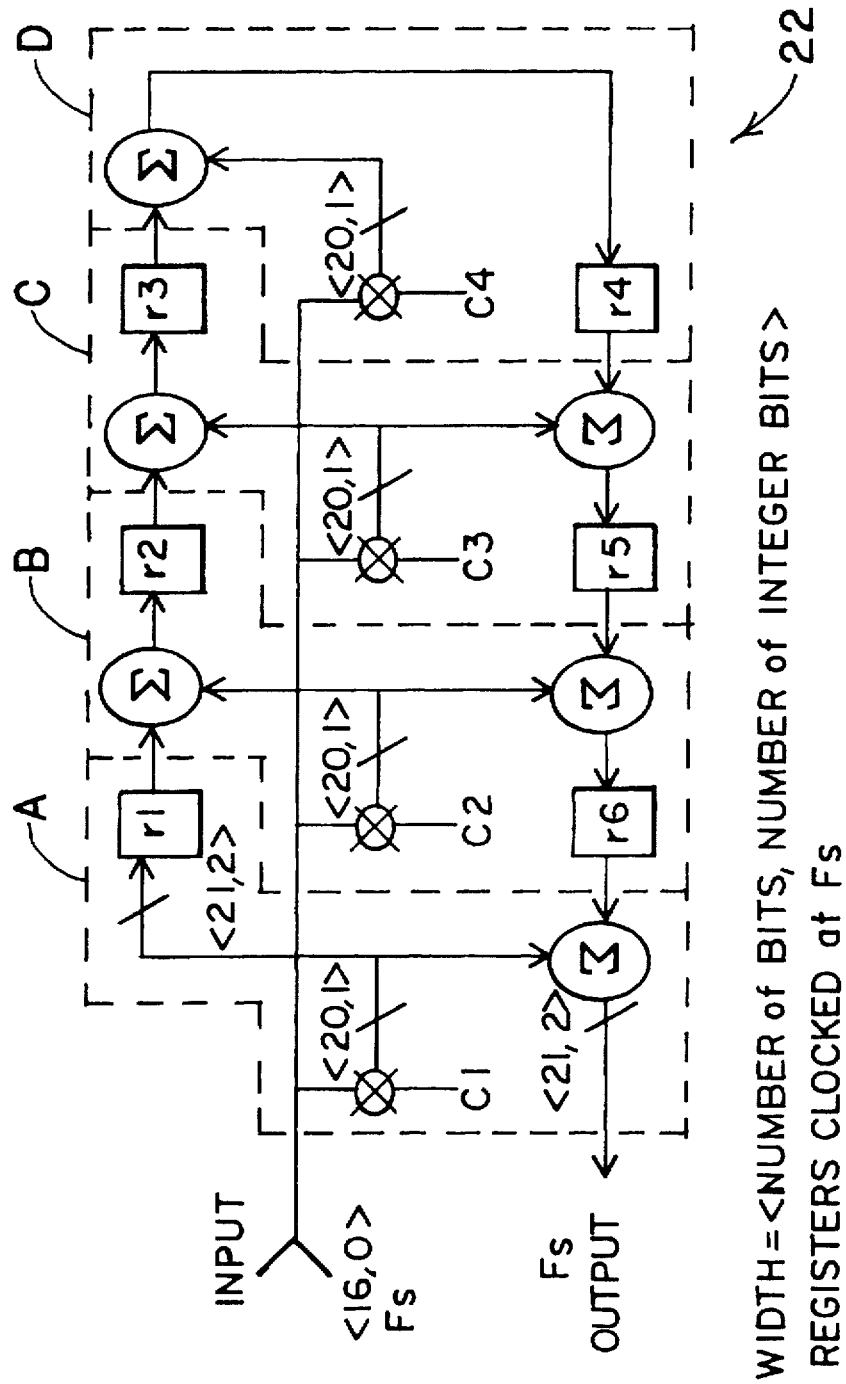
FIG. 9 is the preferred embodiment of the functional block diagram of the compensation stage.

The compensator filter, 22 (FIG. 1) is a linear phase 7 tap FIR, having symmetrical coefficients. It is used to adjust the rolloff of the passband due to Decim. 1. This results in a nearly flat passband response of the entire A/D circuit 10 (FIG. 1). The compensator filter 22 is preferably implemented as a transposed half-band FIR, as was Decim. 2 and Decim. 3, and is shown in FIG. 9. The bit width indicator in FIG. 1 shows the output of Decim. 3 being 16 bits. A bit width of 23 bits is preferably utilized by Decim. 3 for the calculations to maintain the accuracy of the filter. Since the compensation filter 22 is implemented using the same data path architecture 120 (FIG. 11) as Decim. 2 and 3, FIG. 9 shows a bit width of 23 bits for compensation filter functional block 22.

TABLE 3

| Compensator Coefficients | |
|---|---|
| coefficient number | coefficient value |
| 1 | -7.693934583022969E-003 |
| 2 | 9.565316495127612E-003 |
| 3 | -3.365866138777326E-002 |
| 4 | 1.054232901311562 |

Preferred Implementation of Decim. 2, Decim. 3, and the Compensator

Figure 10:
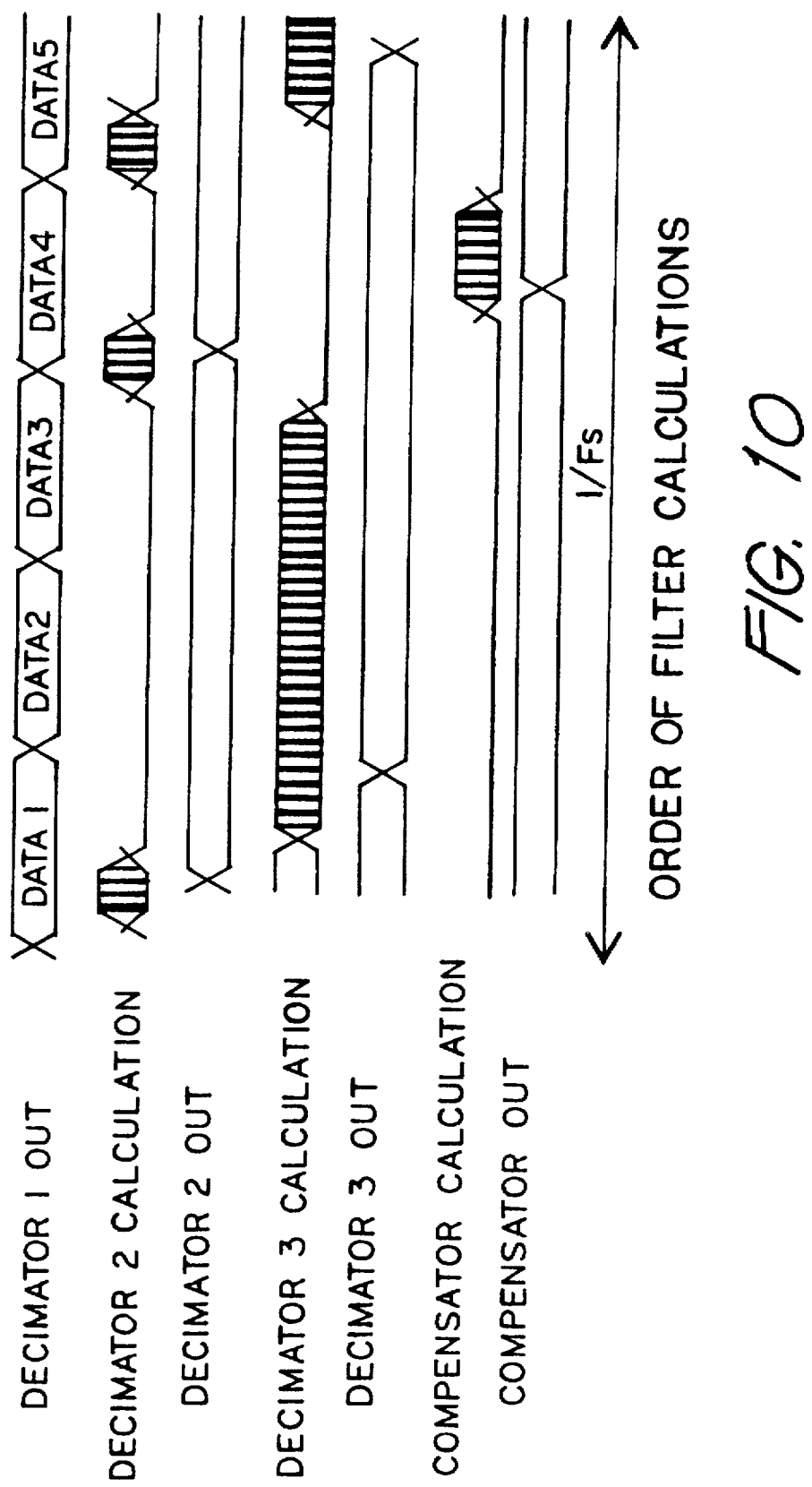
FIG. 10 is a partial timing diagram for calculations performed by the present invention.

The three half-band FIR filters for these three filter stages are implemented utilizing the timing diagram illustrated in FIG. 10. The order of the calculations for the filter outputs for each sample period is also shown in FIG. 10. For every sample period, 1/Fs, the output of Decim. 2 is calculated twice, at 2 Fs. The output of Decim. 3 is calculated at the sample rate, Fs. The compensation filter 22 is calculated at the sample rate, Fs. Each new Decim. 2 output can only be calculated after two new Decim. 1 outputs have be received.

Referring to FIG. 11, the data needed for the filter calculations of Decim. 2, 3 and compensator 22 are all stored in one sample RAM 122. The 'RAM control' block 124 of FIG. 11 controls where the data is stored for each of the three filters. There are 10 storage location used for Decim. 2, 60 for Decim. 3, and 6 for the compensator. The coefficients for all three filters are stored in the coefficient ROM 126. The coefficients are stored in the coefficient ROM 126 in the order they are needed to make the calculations for Decim. 2, Decim. 3, and the compensator, respectively, for each sample period.

The coefficient multiplication of the input data is implemented in FIG. 11 using a summation of multiple shifts of the filter data for the particular filter being calculated. The technique used to implement the coefficient values is described here prior to the explanation of the architecture 120 implementing Decim. 2, Decim. 3 and the compensation 22 filters. The coefficients have varying levels of resolution to achieve the sharp transition region from passband to stopband of 0.1 Fs. The coefficient values of the filters in Tables 1, 2 and 3, above, are given in terms of a 20 bit value with or without an exponential term. The coefficient's number, given in column 1 of Tables 1, 2 and 3 is the position of the coefficient in the filter as given by the index in equations (2) and (3). The order of execution of the coefficient multiplication is by the coefficient number. The coefficients with the smallest magnitude are calculated first, followed by the coefficients with larger magnitudes. This method preserves the accuracy of the smaller coefficients with a constant word length.

The 20 bit coefficients given in Tables 1, 2 and 3 are stored without the exponent in the coefficient memory ROM 126 of FIG. 11 in the order of execution. The data path architecture 120 of FIG. 11 allows the same circuitry to perform the coefficient multiplication in an improved and efficient way for Decim. 2 and Decim. 3 and for compensation stage 22. This allows the coefficient values to be stored compactly in a single coefficient memory ROM 126.

For an efficient calculation of the product terms, the coefficients are stored in the coefficient memory ROM 126 using a coded canonical format as given in equation (7). This reduces the weight, the number of non-zero bits, of the coefficients and therefore reduces the number of summations needed to form the product of the coefficient and data. The definition of these bits are given in equations (7) and (8).

Each 20 bit coefficient (C') of Tables 1, 2 and 3 could be represented in canonical notation as:

$$C' = \Sigma b_j 2^{-j} \quad (7)$$

where $b_j \in (-1, 0, 1)$ j=0–19 where j=0 is the MSB

This results in a minimally weighted number according to the well known canonical notation.

The 20 bit mantissa C', stored in memory are coded as follows. Let $C''_j$ represent each bit in the stored coefficient which is coded as follows:

$$C''_j = 1 \text{ for } b_j = 1 \quad (8)$$

and let $$C''_{j+1} = C''_j = 1 \text{ for } b_j = -1 \text{ where } j=0-19 \quad (9)$$

since $b_j * b_{j-1} = 0$ for canonical representation. In other words, the zero to the left of a −1 bit is changed to a 1 and the −1 is changed to a 1.

The coefficients can not be stored directly in coefficient memory ROM 126 in canonical form since each canonical digit can take on one of three values. However, the coefficients can be stored in the coded $C''_j$ bit form, directly. For 20 bits of resolution in the coefficients, 21 bits need to be stored to allow the MSB to be coded when equal to −1. This results in easy decoding of the coefficient values without separating negative and positive canonical digits and storing them separately. The minimal weight of the representation allows a maximum number of additions of one half the number of bits used to represent the coefficient.

To calculate an output from the multi-stage decimation filter 16, 18 and 20 (FIG. 1) where the sample rate ranges up to 48 KHz for audio systems using a crystal oscillator that is commonly 16.934 MHz or 24.576 MHz, a scheme is needed to perform the multiple accumulate operations along with the shifting operations needed to compensate for the scaled coefficients in one sample period. To use an architecture without a multiplier, typically a bit serial method is used to perform the multiplication task. This involves reading each bit of the coefficient from least significant bit (LSB) to most significant bit (MSB) and for each bit of the coefficient (multiplier) that is a '1', the data (multiplicand) is added in an accumulator. The value in the accumulator is typically shifted by one, equivalent to a multiplication by $2^{-1}$, prior to the next data value being added. However, this bit serial implementation does not have the throughput needed using the crystal frequencies mentioned above for audio rates.

The preferred method, implemented in FIG. 11, operates on 6 bits of the filter coefficient at a time, LSB to MSB. Since the coefficients are coded, as mentioned above, to operate on 6 bits, $C''_j => C''_{j-5}$, the LSB of the next group, $C''_{j-6}$, is needed in order to decode the sign of the $C''_{j-5}{}^{th}$ bit. To decode the bit $C''_j$, of the stored coefficient, C", the sign and magnitude of the MSB from the previous 6 bits is needed. Register r12 of FIG. 11 holds the coded bit, $C''_{j+1}$, 1 LSB over from the current 6 bits being decoded. The decoded sign of the bit in r11 is stored in 'C" 6 bit decode block'. These 9 bits are made available to decode the $C''_j => C''_{j-5}$ bits by always reading ahead 6 bits. The coefficient bits are read out of the 'coef memory ROM' 126, 6 bits at a time, into r10, where j=14, 8, 2.

Below are the logic equations used to calculate the amount of shift needed as a result of decoding the current six bits of the filter coefficient. The amount of shift determined from the decoding of the current 6 coefficient bits is used to control 'shifter 1', 'shifter 2', and 'shifter 3' of FIG. 11, with control inputs 'shift1_sel[2:0]', 'shift2_sel[2:0]', and 'shift3_sel[2:0]' of FIG. 11. The 6 coefficient bits can result in seven possibilities for 'shifter_1', 'shifter_2' and 'shifter_3' of FIG. 11, namely, 6 values to shift the data, or to output a value of zero. If one of the shifters is not needed for a particular calculation, it outputs all zeros. All three shifters may output zero if all the coefficient bits being decoded are zero.

The new value of the sign of $C''_{j+1}$:

$$r12\_sign = r10[0] \,\&\, r10[5] \,\&\, \sim r10[4] \,\|\, \tag{10}$$
$$r10[0] \,\&\, r11[5] \,\&\, r11[4] \,\&\, r11[3] \,\&\, \sim r11[2] \,\|$$
$$r10[0] \,\&\, r11[5] \,\&\, r11[4] \,\&\, r11[3] \,\&\, r11[2] \,\&\, r11[1] \,\&$$
$$\sim r11[0] \,\|$$
$$r10[0] \,\&\, r11[5] \,\&\, r11[4] \,\&\, r11[3] \,\&\, r11[2] \,\&$$
$$r11[1] \,\&\, r11[0]$$
$$\&\, r12 \,\&$$
$$r12\_sign$$

$$shift\_0 = (r11[5] \,\&\, \sim r11[4] \,\| \tag{11}$$
$$r11[5] \,\&\, r11[4] \,\&\, r11[3] \,\&\, \sim r11[2]) \,\|$$
$$r11[5] \,\&\, r11[4] \,\&\, r11[3] \,\&\, r11[2]\&\, r11[1] \,\&\, \sim r11[0] \,\|$$
$$r11[5] \,\&\, r11[3] \,\&\, r11[2] \,\&\, r11[1] \,\&\, \&\, r11[0] \,\&\, r12$$
$$\&\, r12\_sign)$$

$$shift\_1 = (r11[4] \,\&\, \sim r11[3] \,\| \tag{12}$$
$$r11[4] \,\&\, r11[3] \,\&\, r11[2] \,\&\, \sim r11[1]) \,\|$$
$$r11[4] \,\&\, r11[3] \,\&\, r11[2] \,\&\, r11[1] \,\&\, r11[1] \,\&\, r11[0]) \,\&$$
$$\sim r12$$

|

$$r11[4] \,\&\, r11[3] \,\&\, r11[2] \,\&\, r11[1] \,\&\, \&\, r11[0] \,\&\, r12$$
$$\&\, \sim r12\_sign$$

$$shift\_2 = (r11[3] \,\&\, \sim r11[2] \,\| \tag{13}$$
$$r11[3] \,\&\, r11[2] \,\&\, r11[1] \,\&\, \sim r11[0] \,\|$$
$$r11[3] \,\&\, r11[2] \,\&\, r11[1] \,\&\, r11[0] \,\&\, r12 \,\&\, r12\_sign$$

$$shift\_3 = (r11[2] \,\&\, \sim r11[1] \,\| \tag{14}$$
$$r11[2] \,\&\, r11[1] \,\&\, r11[0] \,\&\, \sim r12)$$

$$shift\_4 = (r11[1] \,\&\, \sim r11[0] \,\| \tag{15}$$
$$r11[1] \,\&\, r11[0] \,\&\, r12 \,\&\, r12\_sign)$$

$$shift\_5 = (r11[0] \,\&\, r12 \,\&\, \sim r12\_sign) \,\|\, r11[0] \,\&\, \sim r12) \tag{16}$$
$$TC1 = (r10[0] \,\&\, r11[5] \,\|\, r11[5] \,\&\, r11[4] \,\&\, shift\_1) \tag{17}$$
$$TC2 = (r11[4] \,\&\, r11[3] \,\|\, r11[3] \,\&\, r11[2] \,\&\, shift\_3) \tag{18}$$
$$TC3 = (r11[2] \,\&\, r11[1] \,\|\, r11[1] \,\&\, r11[0] \,\&\, shift\_5) \tag{19}$$

where: shift_x causes a bit shift equivalent to $2^{-x}$ in shifter 1 and shifter 2;

the symbol '$\sim$' is the a logical inversion;

the symbol '||' is the logical OR function; and the symbol '&' is the logical AND function.

The following describes the calculation of the output of Decim. 2, Decim. 3 and compensation filter 22 (FIG. 1) in reference to the architecture 120 of FIG. 11. The output of Decim. 2 is calculated using two Decim. 1 outputs 54 (FIG. 4). The timing diagram of FIG. 10 shows that for every sample period, 1/Fs, four Decim. 1 outputs are available, at a rate of 4 Fs, and two Decim. 2 outputs are calculated. To calculate a Decim. 2 output, at a rate of 2 Fs, two Decim. 1 outputs are stored in register 'r1' and 'r2' of FIG. 11. The output of Decim. 3 is calculated using two Decim. 2 outputs. FIG. 10 shows that for every sample period, 1/Fs, two Decim. 2 outputs are available, at a rate of 2 Fs, and one Decim. 3 output is calculated at the sample rate, Fs. The calculation of Decim. 2, using the signal processing architecture 120 of FIG. 11, will be described.

The architecture of the Decim. 2 filter has been separated, as shown in FIG. 6, into similar but separate processing blocks, A–F, indicated with dotted lines. The Decim. 2 filter calculations within blocks A and F are unique, while the calculations within blocks B–E are the same. The calculations performed using the architecture 120 of FIG. 11 will be described in terms of these FIG. 6 processing blocks.

The description of the operation of the architecture 120 of FIG. 11 will state when the switches 's1–4, s6–8' of FIG. 11 are closed, connecting the output of the registers to the common bus 130. The control signal 'bussel'=1 of FIG. 11 connects the two halves of the bus 130a and 130b. Unless a switch is describes as closed, it should be assumed to be open, which isolates the output of the register connected to each respective switch. The switches can be implemented by various means of driving the bus 130 with a device having a tristate output function. The preferred embodiment uses N-channel and P-channel CMOS devices as a commonly used transmission gate.

To calculate an output of Decim. 2, block A of FIG. 6 must be calculated. The first clock cycle used to calculate block A is as follows. The Decim. $1_{odd}$ output is stored in register 'r1' of FIG. 11. The 6 LSBs of the first Decim. 2 filter coefficient, $Cl_{14-19}$, of the coded coefficients, are read out of the 'coef memory ROM' 126 and stored in register 'r10' of FIG. 11.

The next clock cycle will be referred to as cycle 1 of block A. On this clock cycle, the value in register 'r1' is stored in register 'r2', and a new Decim. $1_{even}$ output is stored in register 'r1'. The even data in register 'r1' is the input data to be multiplied by the Decim. 2 filter coefficients, as shown in FIG. 6. The odd data in register 'r2' is the data value stored in register 'r10' of FIG. 6. The output of register 'r10' of FIG. 11 is stored in register 'r11' of FIG. 11, and the next 6 Decim. 2 filter coefficients bits from the first coefficient, $Cl_{8-13}$, of the coded coefficients, are read out of 'coef memory ROM' 126 and stored in register 'r10' of FIG. 11. The MSB in register 11 is transferred into register 12, which would initially be 0 from reset. Internal to the 'C" 6 bit Decode' block 132 of FIG. 11, the sign of this bit is stored from the previous decode as r12_sign. Initially, this value would also be 0 from reset.

The '6 bit C" decode' block 132 decodes the 6 filter coefficient bits output from register 'r11' according to equations (10)–(16). Equations (10)–(16) are used to control the three shifters, 'shifter 1', 'shifter 2', and 'shifter 3' of FIG. 11. The control signals 'shift1_sel[2:0]', 'shift1_sel[2:0]', and 'shift1_sel[2:0]' of FIG. 11 are used to control the shifters. When the coefficients that were coded according to equations (8) and (9) are decoded, each results is a signed digit. The signals TC1, TC2, and TC3 of FIG. 11 are used to control the 'one's compliment 1', 'one's compliment 2', and 'one's compliment 3' blocks, according to equations (17)–(19). The two's complement is also formed by using these TC(x) signals to control the carry in, 'ci' of 'adder 1', 'adder 2' and 'adder 3', respectively, of FIG. 11. Thus, a total of nine bits of information are used to decode the 6 Decim. 2 filter coefficient C" bits to be multiplied by the data sum to form a partial product, as shown in equation (20).

$$PP_j = (C''_{j-5})*(data). \tag{20}$$

where j=bit positions (19,13,7,1) and j=0 is the MSB, j=19 is the LSB

The product of the 20 bit coefficient times the data sum is calculated as shown using equation (21).

$$P=(((((PP_{19} \times 2^{-6})+PP_{13}) \times 2^{-6})+PP_{7}) \times 2^{-6})+PP_{3} \times 2^{-2}) \tag{21}$$

In summary, the 6 bits in r11, i.e. $C''_j => C''_{j-5}$, the MSB bit in r12, i.e. $C''_{j+1}$, the sign of $C''_{j+1}$ which is stored in the ° 'C" 6 bit decode' block 132 of FIG. 11, and the MSB bit in r10 which represents the $C''_{j-6}$ bit, are all made available to the 'C" 6 bit decode' block 132 of FIG. 11. The shifts of $2^0$ and $2^{-1}$ are implemented in shifter1 of FIG. 11. The shifts of $2^{-2}$ and $2^{-3}$ are implemented in shifter2 of FIG. 11. The shifts of $2^{-4}$ and $2^{-5}$ are implemented in shifter3 of FIG. 11.

During the calculation of the particular products, the switch 's1' and 'bussel' of FIG. 11 are closed, connecting the output register 'r1' to the inputs of the 'one's comp. 1' block. The closed switch also connects the output of register 1, to the input of the 'ones comp 2' block after bit shifting to the right 1 bits, and to the input of the 'ones comp 3' block after bit shifting to the right 2 bits. During the formation of the first partial product of equation (20), when j=−19, the input signal 'pacc_sel'=0 and register 'PACC' is cleared. The shifted data that forms the partial product is added with 'adder 1', 'adder 2' and 'adder 3' of FIG. 11. During this cycle, the 'RAM control' block 124 reads the data value of register 'r9' of FIG. 6.

The next clock cycle will be referred to as cycle 2 of block A. In this clock cycle, the output of 'adder 3' is stored in register 'PACC' through the 'pacc_mux', with 'pacc_sel'= 0. The MSB of register 'r11' is stored in register 'r12' of FIG. 11. The sign of 'r12' is stored in the '6 bit C" decode' block 132 as 'r12_sign'. The coefficient bits in register 'r10', $C1_{18-13}$, is stored in register 'r11, and the next 6 bits of the coded coefficient, $C1_{2-7}$, are stored in register 'r10'. The 'C" 6 bit decode' block 132 decodes the 6 bits in register 'r11' and controls the three shifters and 'one's complement' blocks according to the decoded data using equations (9)–(18). The 'shift4_sel[2:0]' input signal causes the 'shifter 4' block to shift the output of register 'PACC' to the right by 6 bits to align the partial product at the output of 'pacc', $PP_{19}$, to the next partial product being formed, $PP_{13}$. During this cycle, the output of the 'sample RAM' 122 of FIG. 11, is stored in register 'r3', which is equivalent to register 'r9' of FIG. 6.

The next clock cycle will be referred to as cycle 3 of block A. In this clock cycle, the output of 'adder 3', the sum of two partial products $PP_{19}+PP_{13}$, is stored in register 'PACC' through the 'pacc_mux', with control signal 'pacc_sel'=0. The MSB of register 'r11' is stored in register 'r12' of FIG. 11. The sign of 'r12' is stored in the '6 bit C" decode' block 132 as 'r12_sign'. The coefficient bits in register 'r10', $C1_{2-7}$, are stored in register 'r11', and the next 2 bits of the coded coefficient, $C1_{1-0}$, are stored in 'r10'. The 2 coefficient bits are loaded in the MSB position of register 'r10', r10[5:4], while the LSBs are loaded with the pattern, r10 [3:0]=0010. The pattern in the 4 LSBs of 'r10' is used by the data path architecture 120 of FIG. 11 to form an addition in the same cycle as completing the accumulation of partial products of equation (21). This will described below in further detail. The 'C" 6 bit decode' block 132 decodes the 6 coefficient bits in register 'r11', $C1_{2-7}$, and controls the three shifters and 'one's complement' blocks according to the decoded coefficients. The 'shift4_sel[2:0]' control input causes the 'shifter 4' block to shift the output of register 'PACC' to the right by 6 bits to align the accumulated partial product in 'pacc', $PP_{19}+PP_{13}$, with the next partial product being formed, $PP_7$. During this cycle, the output of 'r3' of FIG. 11, which is 'r9' of FIG. 6, is stored in register 'r4' of FIG. 11.

The next clock cycle will be referred to as cycle 4 of block A. In this clock cycle, the output of 'adder 3' is stored in register 'PACC' through the 'pacc_mux', with control signal 'pacc_sel'=0. The MSB of 'r11' is stored in 'r12' of FIG. 11. The sign of 'r12' is stored in the '6 bit C" decode' block 132 as 'r12_sign'. The coefficients bits in 'r10', $C1_{1-0}$, is stored in 'r11' along with the 4 coefficient bits stored in the LSBs of 'r10'. Since only 2 coefficient bits are decoded, they result is potential shifts of $2^0$ or $2^{-1}$ which are implemented in 'shifter 1'. The bits stored in the unused LSBs of 'r10' cause the 'shifter 2' block and 'shifter 3' block to output zero.

The next clock cycle will be referred to as cycle 5 of block A. In this clock cycle, the output of 'adder 2' is stored in register 'PACC' through the 'pacc_mux' with 'pacc_sel'= 1. Register 'r12' and the stored 'r12_sign' bits are cleared. Register 'r11' is cleared, with the value '000010'. The decode of 'r11' by the 'C" 6 bit decode' block 132 results in 'shifter 1' and 'shifter 2' outputing zero. The 6 bits of the next coded coefficient, $C2_{13-19}$, are stored in 'r10'. The 'bussel' control input, which has been closed, is opened. The control switch 's4' is closed, which connects the output of 'r4' with the input of the 'ones comp 3' block. The control signal 'shift4_sel[2:0]' causes 'shifter 4' to shift the output of register 'pacc' by 2 bits. The output is shifted by 2 bits instead of 6, as in previous cycles, because the last partial product was obtained with the last 2 coefficient bits, $C_{0-1}$ being read. The output of 'adder 2' contains the product of the data in 'r1' and the coefficient C1, P1, as given by equation (21). The output of 'adder 3' of FIG. 11 is the product, P1, plus the data in register 'r9' of FIG. 6. This is the new output of Decim. 2. This concludes the calculations performed for block A of FIG. 6, although the storing of the data on the output of the value in 'adder 2' and 'adder 3' occurs on subsequent cycles.

The next clock cycle will be referred to as cycle 1 of block B. This cycle stores the output of 'adder 3', the Decim. 2 output, in register 'r5' of FIG. 11, to be stored in 'r6' on the next cycle for input to be utilized in Decim. 3 calculations. This cycle begins the processing of block B, as shown in FIG. 6. Registers 'r10', 'r11', and 'r12' of FIG. 11 are clocked, advancing the data in the registers similar as described previously for each of the cycles of processing block A, above. Register 'r10' of FIG. 11 stores the next coded filter coefficient, $C2_{8-12}$, read out from the 'coef memory ROM' 126. Register 'r11' stores the value in 'r10', $C2_{13-19}$. The '6 bit C" decode' block 132 decodes the coefficient bits $C2_{13-19}$. The control signal 'bussel'=1, which connects the output of 'r1' to the 'ones comp 3' block. The switch state of 's4'=0 isolates the output of 'r4'. Register 'pacc' is cleared, and the control signal 'shift4_sel[2:0]' causes 'shifter 4' to shift the output of 'pacc' by 6 bits. Although this not used in this first cycle of calculating P2, because the contents of 'pacc' have been cleared, it is used in the subsequent 3 cycles. The output of 'adder 3' contains the first partial product, $PP_{19}$, of C2 times the data, $PP2_{19}$.

The next 3 clock cycles, cycles 2–4 of block B, proceed in a manner similar to cycles 2–4 of block A. During cycle 2, the data stored in 'r5' is stored in 'r6'. In cycles 3 and 4, the data read out of the 'sample RAM' 122 and stored in 'r4' of FIG. 11 is data representing register 'r8' of FIG. 6. The data stored in 'r3' of FIG. 11 is data representing register 'r1' of FIG. 6.

The next clock cycle is cycle 5 of block B. In this clock cycle, the output of 'adder 2' is stored in register 'pacc' through the 'pacc_mux' by control signal 'pacc_sel'=1. Register 'r11' is cleared with the value '000010'. The decode of 'r11' by the 'C" 6 bit decode' block 132 results in 'shifter 1' and 'shifter 2' outputing zero. The 'bussel' control input, which has been closed, is opened. The control switch 's4' is closed, connecting the output of 'r4' of FIG. 11, which is the value in 'r8' of FIG. 6, to the input of the 'ones comp 3' block of FIG. 11. The control signal 'shift4_sel[2:0]' causes 'shifter 4' to shift the output of register 'pacc' by 2 bits. The output is shifted by 2 bits instead of 6 bits, as in previous cycles, because the last partial product was obtained with the last 2 coefficient bits, $C_{0-1}$. The output of 'adder 2' contains the product of the data in 'r1' of FIG. 11 and the filter coefficient C1, P1, as given by equation (21). The output of 'adder 3' is the product, P1, plus the data in register 'r8' of FIG. 6. This is the new output of 'r9' of FIG. 6.

The next clock cycle will be referred to as cycle 6 of block B. This cycle stores the output of 'adder 3', the new 'r9' of FIG. 6, in register 'r5' of FIG. 11. On the next cycle, cycle 1 of block C, the filter tap value in register 'r5' of FIG. 11 will be stored in the 'sample RAM' 122. The switch 's4' is opened, to isolate 'r4', and switch 's3' is closed. The control input 'shifter4_sel[2:0]' causes 'shifter 4' to pass the output of 'pacc' with no shift. Since 'r3' contains the value of register 'r1' in FIG. 6, the output of 'adder 3' of FIG. 11 is the new value of register 'r2' of FIG. 6.

During the next clock cycle, cycle 1 of block C, the output of 'adder 3' will be stored in register 'r5' of FIG. 11. On cycle 2 of block C, the new value of register 'r2' of FIG. 6 will be stored in the 'sample RAM' 122 of FIG. 11.

The processing of blocks C and D of FIG. 6 proceed in a similar manner as block B. Each processing block reads the necessary data from the 'sample RAM' 122. For block C, the data representing registers 'r7' and 'r2' in FIG. 6 is stored in 'r4' and 'r3' of FIG. 11.

The processing of block E proceeds in a similar manner as blocks B–D, except during cycle 5 and 6. There, an extra cycle is used to sum in the odd Decim. 1 output value, from register 'r10' of FIG. 6, that is stored in 'r2' of FIG. 11. By opening the switches 's3' and 's4' and closing 's2' of FIG. 11, the addition summation is performed in 'adder 3'.

The calculations necessary to perform Decim. 3 are now described. Since Decim. 3 is of the same form as Decim. 2, as discussed previously, the calculations needed to execute block A of FIG. 8 are the same as those needed to perform block A of FIG. 6.

The execution of the processing blocks A–D, where there are 26 processing blocks, not shown, between blocks C and D of FIG. 8 which are identical to each other and to block C, except for the coefficients, require the last even output of Decim. 2.

The processing of block E of FIG. 8 uses the last odd data of Decim. 2. The last 2 outputs of the Decim. 2 are stored in registers 'r6' and 'r7' of FIG. 11.

The processing of block A of Decim. 3 proceeds in a similar manner as the processing of block A of Decim. 2, except the even input data is located in register 'r6'. The output of Decim. 3, which is obtained when block A of FIG. 8 is calculated, is stored in 'r5' of FIG. 11 and then stored in 'r8'. The Decim. 3 output is then used from register 'r8' as an input to the compensator filter 22 (FIG. 1) which is also implemented by the architecture 120 of FIG. 11.

The processing of blocks B–D for Decim. 3 of FIG. 8 is in a similar manner as for blocks B–D of Decim. 2 of FIG. 6, described above.

The processing of block E of Decim. 3 of FIG. 8 is performed in a similar manner as block E of Decim. 2 of FIG. 6, except the odd input data for Decim. 3 is output from 'r7' of FIG. 11 instead of 'r2' as for block E of Decim. 2.

After completing the calculations for Decim. 3 and storing the output in 'r8' of FIG. 11, a second calculation for Decim. 2 is performed, as depicted in the FIG. 10 timing diagram. When block A of FIG. 6 is calculated, and the output of Decim. 2 is stored in 'r5' of FIG. 11, the output is then stored in 'r6', and the value of 'r6' is stored in register 'r7'. Since there are 2 Decim. 2 outputs calculated between each Decim. 3 output calculation, 'r6' and 'r7' of FIG. 11 preferably always contain the last even and odd outputs of Decim. 2 for use in computing the Decim. 3 output.

After the second Decim. 2 calculation is complete, the calculations for the compensation filter 22 (FIG. 1) are performed, as shown by the timing diagram of FIG. 10. The last output of Decim. 3 is stored in 'r8' of FIG. 11. The calculations for block A of FIG. 9 are performed in a manner similar to those for block A of Decim. 2, with the exception that the input data for the compensation calculation is output from 'r8' of FIG. 11 instead of 'r1'. The calculations of blocks B and C are performed in a manner similar to those for blocks B–D of Decim. 2. The calculation of block D for the compensator 22 is different from that of block E of Decim. 2, since for the compensation calculation there is no odd data being added during cycle 5. The control signals from the '6 bit C" decode' block 132 of FIG. 11 cause the 'shifter 3' block to output zero.

This concludes the description of the calculations for Decim. 1, Decim. 2, Decim. 3 and compensator 22.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A method of operating a digital decimation filter, comprising the steps of:

(a) providing a multi-bit digital input signal;

(b) providing a plurality of digital filter coefficients, each said coefficient comprised of a plurality of bits, n;

(c) providing a coefficient scaling factor for each said filter coefficient;

(d) obtaining a partial product by multiplying a plurality of bits, f, of a selected one of said filter coefficients by said input signal, where f<n;

(e) obtaining an other partial product by multiplying another plurality of bits, s, of said selected one of said filter coefficients by said input signal, where s<n;

(f) obtaining an accumulated partial product by scaling said other partial product by a selected partial product scaling factor and then adding said scaled other partial product to said partial product;

(g) obtaining a product by repeating steps (e)–(f) and adding each successive calculated accumulated partial product to the prior accumulated partial product until all bits of each said selected filter coefficient have been processed;

(h) obtaining an other product by repeating steps (d)–(g) for another one of said digital filter coefficients;

(i) obtaining an accumulated product by scaling said product by a selected coefficient scaling factor and then adding said scaled product to said other product;

(j) obtaining a filter output final product by repeating steps (h)–(i) and adding each successive calculated product to the prior accumulated product until each of said filter coefficients has been entirely processed; and (k) outputting a decimated multi-bit output signal, where said output signal represents the value of said filter output final product.

2. The method of claim 1, wherein said decimation filter being operated upon is transposed.

3. The method of claim 1, wherein said decimation filter being operated upon comprises a plurality of cascaded FIR filters.

4. The method of claim 3, wherein said cascaded FIR filters comprise half-band FIR filters.

5. A method of operating a sinc filter to decimate a multi-bit digital input signal, comprising the steps of:

(a) providing a multi-bit digital input signal, said input signal comprised of a plurality of sequentially input data values;

(b) providing x integration stages, wherein said stages are sequentially, arranged from one to x;

(c) providing a plurality of data storage registers;

(d) storing n input data values in said data storage registers, wherein n is greater than one, and wherein n is evenly divisible into x;

(e) calculating an integrated output of the nth integration stage using said stored n input data values, wherein if n=x then steps (f)–(k) are not performed;

(f) storing said calculated output of said nth integration stage;

(g) storing a next sequential n input data values in said data storage registers;

(h) calculating an integrated output of the 2×nth integration stage using said stored calculated output of said nth integration stage and said stored next sequential n input data values, wherein if 2×n=x then steps (i)–(k) are not performed;

(i) storing said calculated output of said 2×nth integration stage;

(j) storing a further next sequential n input data values in said data storage registers;

(k) calculating an integrated output of a 3×nth integration stage using said stored calculated output of said 2×nth integration stage and said stored calculated output of said nth integration stage and said stored further next sequential n input data values;

(l) down-sampling said integrated output of said last performed calculating step, by a decimation factor;

(m) differentiating said down-sampled calculated output; and (n) outputting said differentiated output as an output of said sinc filter.

6. A digital decimation filter, comprising:

(a) a multi-bit digital input signal;

(b) a coefficient memory device having a plurality of digital filter coefficients stored therein, wherein each said coefficient comprises a plurality of bits;

(c) a coefficient decode circuit having an output, wherein at least a portion of each plurality of bits of each said filter coefficient is provided to said decode circuit;

(d) a multiplication block, wherein said decode circuit output is input to and controls the operation of said multiplication block;

wherein said multiplication block multiplies each of said filter coefficients by said input signal such that only a portion of each plurality of bits of each said filter coefficient is multiplied by said input signal during any multiplication operation; and wherein a signal is output from said multiplication block after all of said bits of each said coefficient has been multiplied by said input signal;

wherein said multi-bit input signal is stored in an input signal memory device;

wherein a first selected value of said input signal is stored in a first location in said input signal memory device and is provided to a first register;

wherein a second selected value of said input signal is stored in a second location in said input signal memory device and is provided to a second register;

wherein the contents of said first register and said second register is provided to an adder; and wherein said adder includes an output which is provided to said multiplication block.

7. A digital decimation filter implementing a nth order sinc filter, comprising:

(a) a multi-bit digital input signal comprised of a plurality of input data values;

(b) a first input signal storage device having an input and an output;

(c) a second input signal storage device having an input and an output;

(d) a first adder having an output and a plurality of inputs;

(e) a second adder having an output and a plurality of inputs;

(f) a first group of data storage registers;

(g) a second group of data storage registers;

(h) a first selection device which selects between said output of said second input signal storage device and an output from said first group of data storage registers, to be input to an input of said first adder;

(i) a second selection device which selects between said output of said first input signal storage device and an output from said first group of data storage registers, to be input to another input of said first adder;

(j) a third selection device which selects between said output of said first adder and an output from said second group of data storage registers, to be input to an input of said second adder; and (k) a fourth selection device which selects between an output of said first group of data storage registers and an output from said second group of data storage registers, to be input to another input of said second adder;

wherein said output of said second adder is input to an input of said first group of data storage registers and to an input of said second group of data storage registers; and wherein a filter output is output from said second group of data storage registers.

8. The filter of claim 7, wherein said filter comprises an nth order sinc filter comprising n integration stages and n differentiation stages, where n is greater than one.

9. The filter of claim 8, wherein an output from said n integration stages is stored in said first group of data storage registers.

10. The filter of claim 8, wherein an output from said n differentiation stages is stored in said second group of data storage registers.

* * * * *